(12) United States Patent
Kakoschke et al.

(10) Patent No.: US 7,880,264 B2
(45) Date of Patent: Feb. 1, 2011

(54) INTEGRATED CIRCUIT ARRANGEMENT COMPRISING ISOLATING TRENCHES AND A FIELD EFFECT TRANSISTOR

(75) Inventors: Ronald Kakoschke, München (DE); Franz Schuler, Poing (DE)

(73) Assignee: Infineon Technologies AG, Munich (DE)

( * ) Notice: Subject to any disclaimer, the term of this patent is extended or adjusted under 35 U.S.C. 154(b) by 20 days.

(21) Appl. No.: 11/273,618

(22) Filed: Nov. 14, 2005

(65) Prior Publication Data

US 2006/0113626 A1 Jun. 1, 2006

Related U.S. Application Data

(63) Continuation of application No. PCT/EP2004/050718, filed on May 5, 2004.

(30) Foreign Application Priority Data

May 14, 2003 (DE) .................. 103 21 742

(51) Int. Cl.
*H01L 27/115* (2006.01)
(52) U.S. Cl. ............ 257/513; 257/390; 257/E27.103
(58) Field of Classification Search ............ 257/315, 257/506, 513, E29.3, 390, E27.103, E21.662
See application file for complete search history.

(56) References Cited

U.S. PATENT DOCUMENTS

| | | | |
|---|---|---|---|
| 4,945,069 A | 7/1990 | Carter | |
| 4,979,146 A * | 12/1990 | Yokoyama et al. | 365/185.14 |
| 5,229,312 A | 7/1993 | Mukherjee et al. | |
| 5,617,351 A * | 4/1997 | Bertin et al. | 365/185.05 |
| 5,679,970 A * | 10/1997 | Hartmann | 257/320 |
| 6,033,959 A | 3/2000 | Fu | |
| 6,034,894 A | 3/2000 | Maruyama et al. | |
| 6,057,580 A | 5/2000 | Watanabe et al. | |
| 6,060,740 A | 5/2000 | Shimizu et al. | |
| 6,087,222 A | 7/2000 | Jung Lin et al. | |
| 6,153,472 A | 11/2000 | Ding et al. | |
| 6,355,524 B1 * | 3/2002 | Tuan et al. | 438/257 |
| 6,438,030 B1 | 8/2002 | Hu et al. | |

(Continued)

FOREIGN PATENT DOCUMENTS

| | | |
|---|---|---|
| EP | 0 202 716 | 9/1988 |
| EP | 0 282 716 | 9/1988 |

OTHER PUBLICATIONS

Katsuhiko Hieda, Fumio Horiguchi, Hidehiro Watanabe, Kazumasa Sunouchi, Ikuko Inoue and Takeshi Hamamoto, *Effects of a New Trench-Isolated Transistor Using Sidewall Gates*, pp. 1615-1619, IEEE Transactions on Electron Devices, vol. 36, No. 9, Sep. 1989.

*Primary Examiner*—Leonardo Andújar
*Assistant Examiner*—Christopher M Roland
(74) *Attorney, Agent, or Firm*—Brinks Hofer Gilson & Lione

(57) ABSTRACT

A memory circuit arrangement and a fabrication method are disclosed. The memory circuit arrangement has a memory cell area. The memory cell area contains memory cell transistors, one column of which are selected using a triple gate area selection transistor. The transistor has gate area that extends into isolating trenches. The isolating trenches isolate the memory cell in different columns of the memory cell array.

7 Claims, 10 Drawing Sheets

U.S. PATENT DOCUMENTS 6,790,718 B1 * 9/2004 Nakagawa ................ 438/195
6,952,031 B2 * 10/2005 Yamauchi ................ 257/314
2002/0011612 A1 1/2002 Hieda
2002/0024081 A1 2/2002 Gratz

* cited by examiner

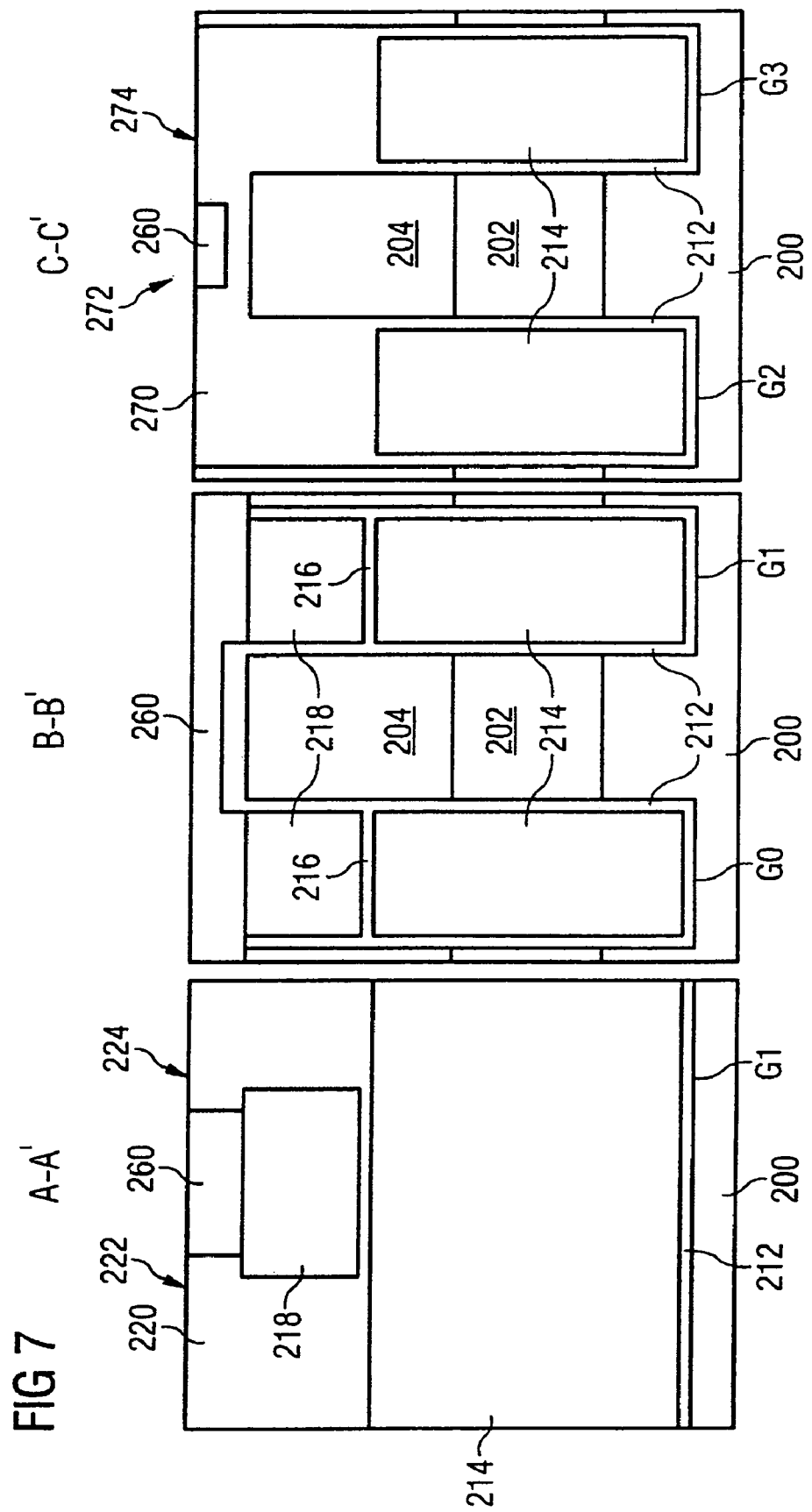

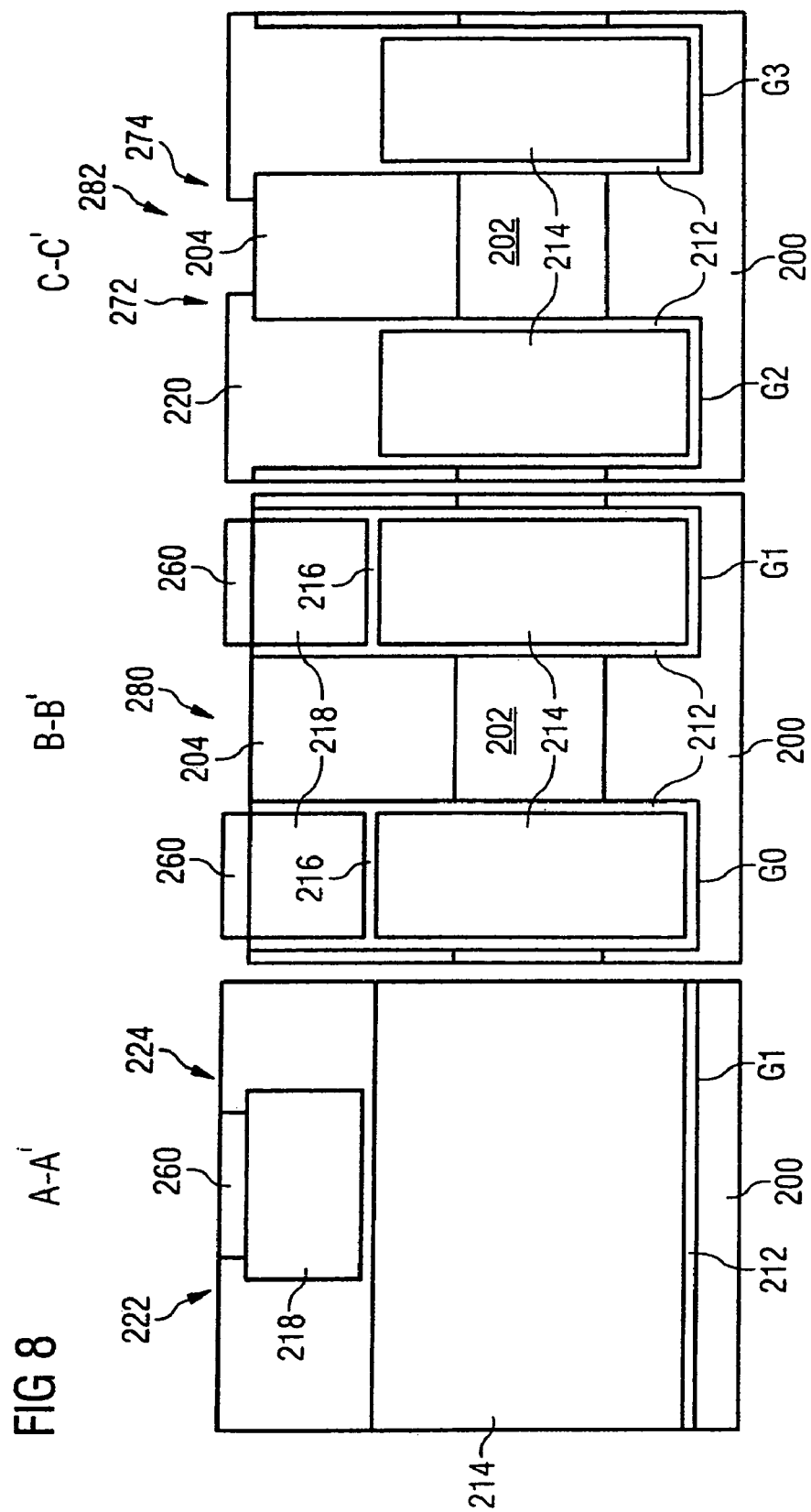

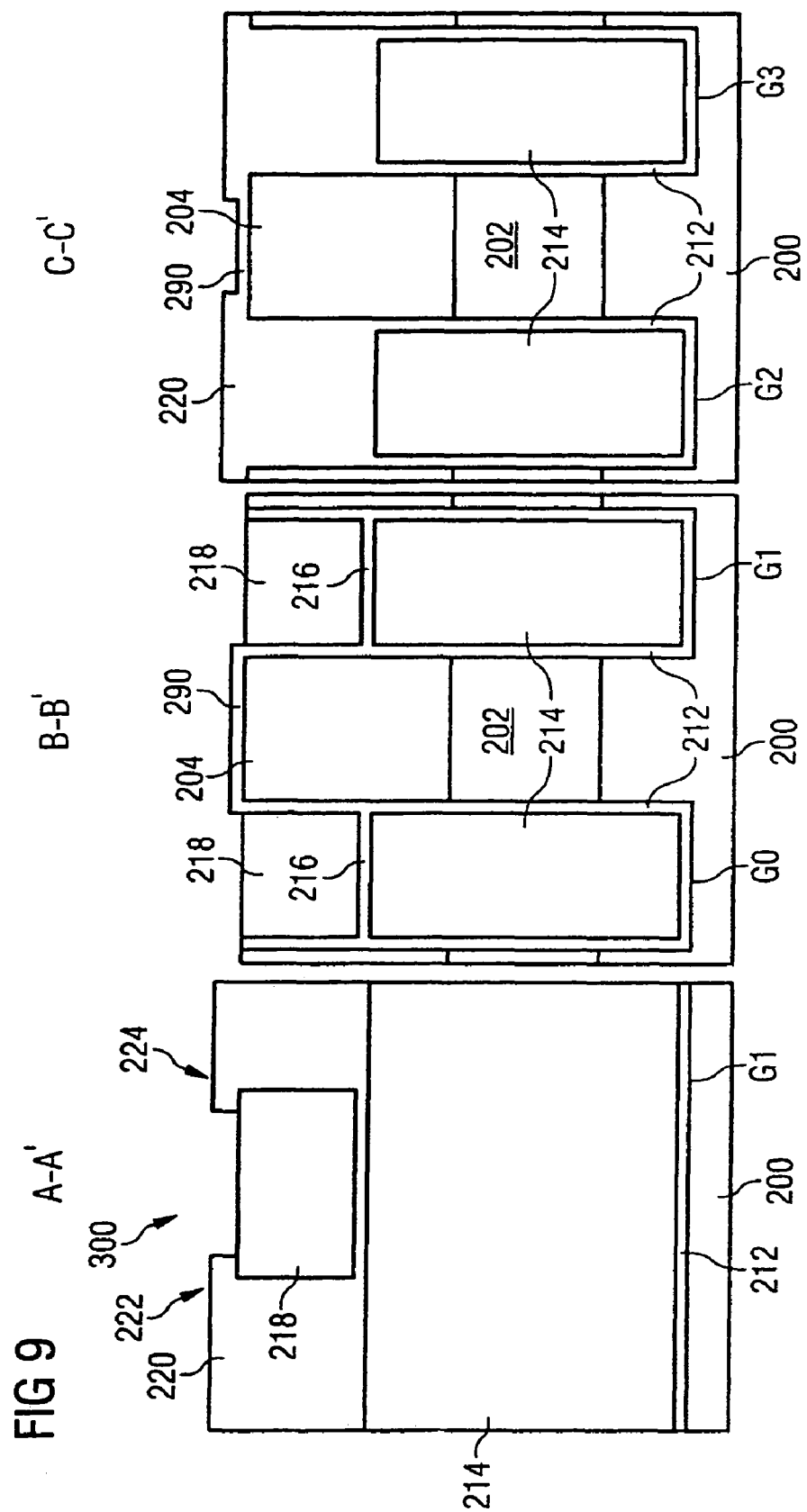

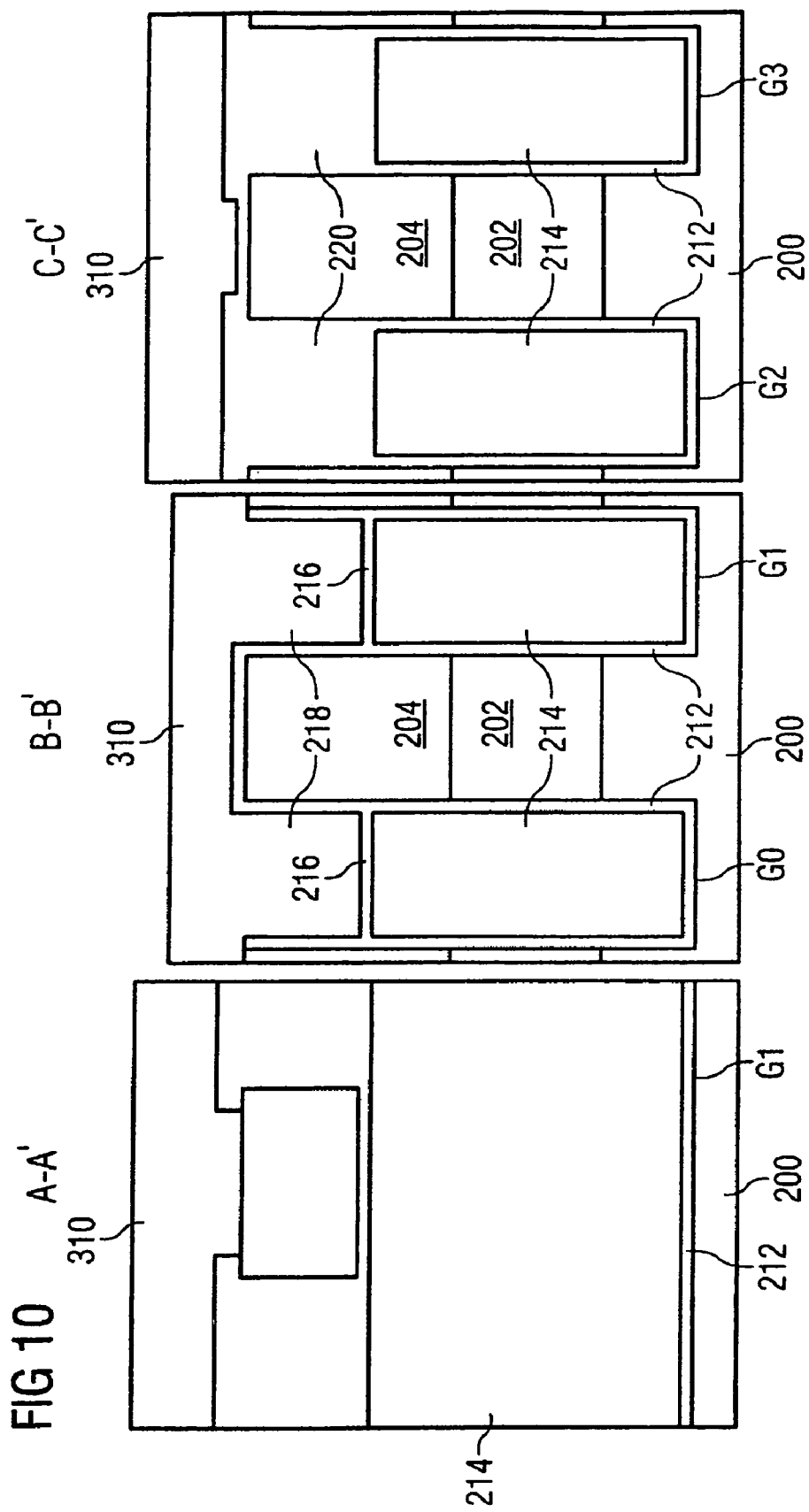

INTEGRATED CIRCUIT ARRANGEMENT COMPRISING ISOLATING TRENCHES AND A FIELD EFFECT TRANSISTOR

PRIORITY CLAIM

This application is a continuation of international application PCT/EP2004/050718, filed on May 5, 2004, which claims the benefit of priority to German Application DE 103 21 742.8 filed on May 14, 2003, both of which are incorporated by reference in their entirety.

TECHNICAL FIELD

The present embodiments relate to an integrated circuit arrangement, in particular to an integrated memory circuit arrangement which contains a doped substrate in which isolating trenches are used for isolation of field effect transistors in the circuit arrangement between the memory cells in one column of a memory cell array and perhaps outside the memory cell array.

BACKGROUND

The vast majority of electronic devices employ integrated circuits for various reasons. Of these electronic devices, many of the integrated circuit arrangements include a memory cell array containing a large number of memory cells. The memory cells are formed in a matrix and particular memory cells are addressed by a field effect transistor. Furthermore, the integrated circuit arrangements contain isolating trenches serve solely to isolate various subareas of the integrated circuit arrangement from other subareas.

However, many integrated circuit arrangements are complicated, use a substantial amount of valuable real estate on the semiconductor wafer on which they are fabricated, and are limited in integration, particularly when including field effect transistors which switch currents or voltages of widely varying amounts. In addition, many integrated circuit arrangements are difficult to fabricate, requiring multiple exacting process steps that are costly in terms of material usage and process time. As the number and complexity of process steps increases, the ultimate yield of the integrated circuit arrangement decreases, thereby driving up costs to the manufacturer and ultimately the consumer.

BRIEF DESCRIPTION OF THE DRAWINGS

The present invention is illustrated by way of example and not limited to the accompanying figures in which like references indicate similar elements. Exemplary embodiments will be explained in the following text with reference to the attached drawings, in which:

FIGS. 4 to 10 show production stages during the production of the memory cell area, in each case on the basis of three cross sections.

Figure 1:
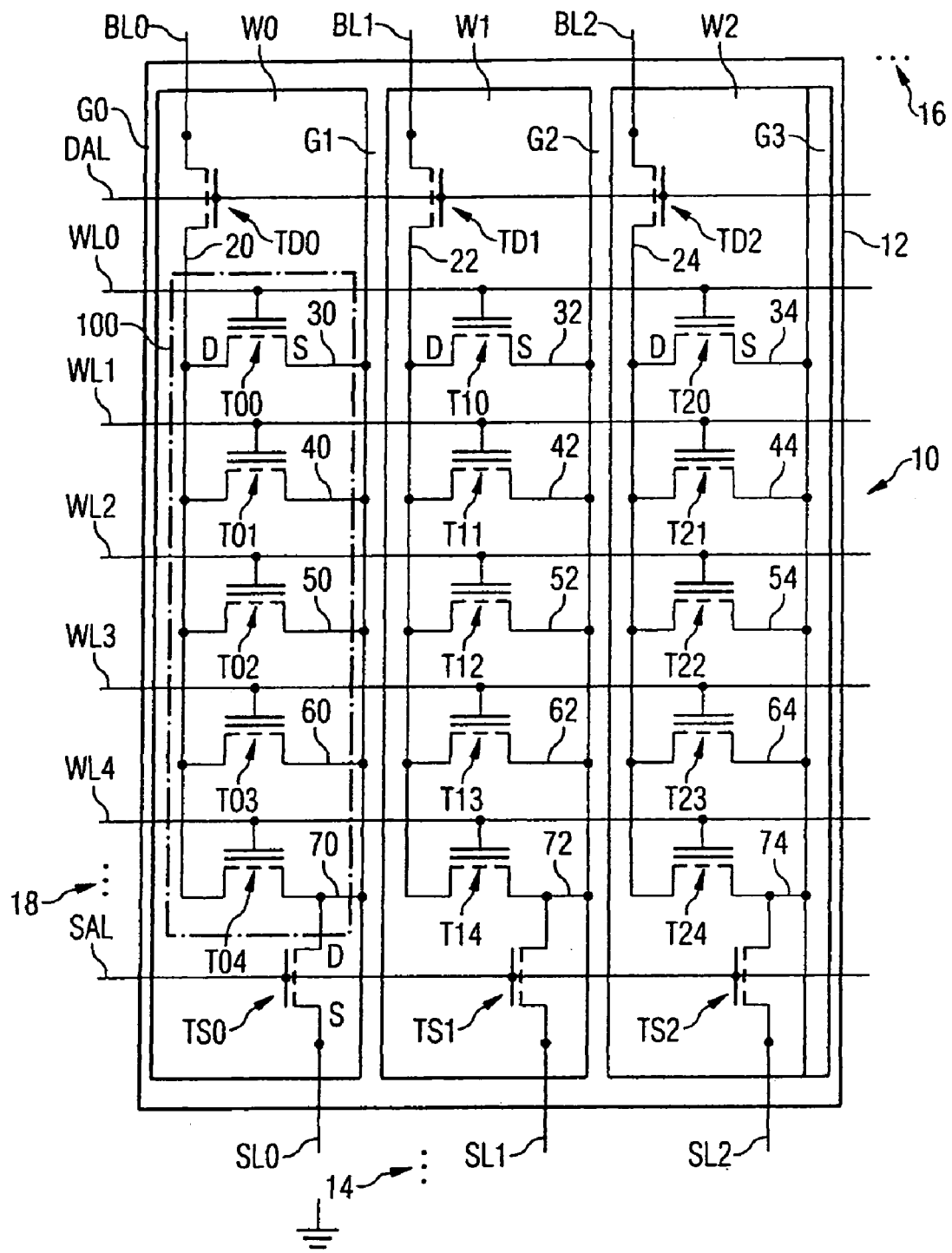
FIG. 1 shows the circuit diagram of a memory cell area in a flash EEPROM (Electrically Erasable Programmable Read Only Memory)

Skilled artisans appreciate that elements in the figures are illustrated for simplicity and clarity and have not necessarily been drawn to scale.

SUMMARY OF THE INVENTION

Overcoming the enumerated drawbacks and other limitations of the related art, the present invention provides an integrated circuit arrangement. The integrated circuit arrangement includes a substrate and a memory cell array having memory cells arranged in a matrix on the substrate. Additionally, a field effect transistor is provided for enabling simultaneous selection of the memory cells in a column or in a column section of the memory cell array. Isolating the field effect transistor from its surrounding area is an isolating trench, which is bounded by a french base, trench walls, and a trench rim. An intermediate wall isolating area containing electrically insulating material in a central area is located between two opposite trench walls and at a distance from the trench base, the isolating trench containing an electrically conductive material that forms a gate area of the field effect transistor.

DETAILED DESCRIPTION

An integrated circuit arrangement contains a field effect transistor and an isolating trench. The level of integration of the integrated circuit arrangement is increased by using an isolating trench that not only isolates subareas of the integrated circuit arrangement from other subareas, but also accommodates the gate area of a field effect transistor. If the gate area of a field effect transistor is arranged both within the isolating trench and outside the isolating trench, then the effective control width or the control length of the control area of the field effect transistor can be increased in a simple manner while using the same chip area, or the chip area used can be reduced while the width and/or length of the gate area remains the same.

In general, an isolating trench contains a trench wall isolating area composed of electrically insulating material on two mutually opposite trench walls. The base of the trench can likewise be covered with electrically insulating material or can be free of any isolating area. The isolating trench contains an intermediate wall isolating area composed of electrically insulating material in a central area between the two opposite trench walls. The isolating trench is typically filled completely with an insulating material.

In the present circuit arrangement, the isolating trench has a central area between two opposite trench walls at a distance from the trench base which is greater than $\frac{1}{5}$ or greater than $\frac{1}{3}$ of the trench depth. The isolating trench is filled in an area close to the trench rim with an electrically conductive material which forms the gate area of a field effect transistor which is isolated from its surrounding area with the aid of the isolating trench. Only the lower area of the isolating trench is thus used for electrical isolation. The upper area of the isolating trench is used to accommodate the gate area of a field effect transistor.

With respect to isolation, when the gate of the field effect transistor is at 0 volts (i.e. the field effect transistor is switched off), the isolating trench prevents a drain voltage of the field effect transistor (which may be more than 5 volts) from reaching a drain area of an adjacent field effect transistor which is at a lower potential. This lower potential may be 0 volts or a negative potential, for example.

In addition, when there is a positive potential, for example of 10 volts, at the gate or on the gate area of the field effect transistor, the field effect transistor may be switched on. The isolating trench prevents the formation of a parasitic field effect transistor underneath the control line to which the field effect transistor and the adjacent field effect transistor are connected. Otherwise, a drain potential, for example of 1 volt, of the field effect transistor may pass through a parasitic field effect transistor such as this to the gate area of the adjacent field effect transistor if this were at a lower potential, for example at 0 volts.

The isolating area and the trench base contains either a conductive material or an insulating material arranged between the intermediate wall isolating area and the trench base. By way of example, deep trenches have a depth of more than 1 µm or more than 2 µm. The electrically conductive material may comprise doped polycrystalline silicon, while the insulating material contains an oxide with very good electrical isolation characteristics. The isolating trench may contain an insulating material in area which is close to the trench rim and is adjacent to a gate area of another field effect transistor, instead of the conductive material.

In consequence, planar field effect transistors and field effect transistors whose gate areas also extend into the isolating trench are arranged along a trench. This results in a degree of freedom which allows field effect transistors to be selected whose gate areas are intended to extend into the isolating trench. Field effect transistors which use only a comparatively narrow gate area or in which the gate area are not arranged in an isolating trench without problem, for example floating gate transistors, can be produced in a simple manner on the same isolation trench by filling the area which is close to the trench rim in the area of the gate areas of these field effect transistors with an insulating material.

The conductive material extends beyond the trench wall into an isolating trench which is adjacent to the isolating trench. The conductive material forms the gate area of the same field effect transistor and/or the gate area of another field effect transistor in the adjacent trench. This results in a triple gate transistor in a simple manner, by using the upper area of isolating trenches for arrangement of the side gate areas of the triple transistors.

The isolating trench passes through a doped layer which is arranged in the substrate, for example a doped well. The trench ends in a layer or well of the opposite dopant type. Alternatively, the trench also passes through a layer of the opposite dopant type and ends in a further dopant layer or in the substrate. This results in the isolating trench isolating the doped layers, which improve the electrical characteristics of the circuit and offer additional drive capabilities.

The circuit arrangement contains a memory cell array comprising a large number of memory cells which are arranged in the form of a matrix. The field effect transistor whose gate area extends into the isolating trench is a selection transistor for simultaneous selection of the memory cells in one column or in one column section. When column sections are selected, the expression local column sections is also used, in particular local bit lines, which can be connected to a global bit line. In order to ensure that the access time to cell transistors is as fast as possible, all of the voltage drops on the read current path are minimized. Since the selection transistor makes a significant contribution to this, the voltage drop across it are minimized by means of an effective channel width which is as large as possible. In consequence, the gate area of the selection transistor is as wide as possible. The additional width does not, however, lead to additional chip area being used, because a portion of the gate area of the selection transistor is arranged in the isolating trench.

The isolating trench in which the gate area of the selection transistor is located also extends between the memory cells in different columns of memory cells. The depth of the isolating trench differs in the area of the selection transistor from the depth in the area of the memory cell array. The isolating trench may be deeper in the area of the selection transistor than in the area of the memory cell array.

A selection line for selection of the memory cells in one column or one column section of memory cells is located in the isolation trench. This allows the isolation trenches to be arranged close to one another. This small separation can be reduced further by arranging the comparatively broad gate areas of the selection transistors in isolation trenches.

Memory cells in at least one column are conductively connected to one another via a doped layer. The doped layer may be located underneath the channel area of the memory cells in the column. This concept of a "buried" source line is explained, for example, in U.S. Pat. No. 6,438,030 B1. In this situation as well, the isolation trenches can be arranged close to one another. If the selection transistors are in the form of triple gate transistors, this leads to a further reduction in the distance between the isolation trenches, and thus to an even greater integration level.

An insulating isolation layer and a conductive layer may be arranged on the side of the gate area of the selection transistor facing away from the substrate, and have been jointly structured together with at least a part of the gate area. This permits the further conductive layer in the area of the selection transistor to remain after fabrication. The further insulating layer is used in the area of the cell array, in order to drive transistors. However, this layer has no disturbing effect in the area of the selection transistor. The insulating isolation layer may be a multiple layer, for example an ONO layer (oxide, nitride, oxide).

The gate area may extend at most only as far as half the trench depth. The remaining part of the trench can be used for isolation purposes, or for other purposes.

The selection transistor may be a transistor with a gate area which surrounds a substrate area, in particular a triple gate transistor. Transistors such as these contain two mutually opposite gate areas, which are connected by means of a central gate area and have excellent electrical characteristics.

To produce the circuit arrangement an isolating trench is first fabricated in a substrate. Insulating material is then introduced into the trench. After this, non-insulating material such as conductive material or a doped semiconductor is then introduced into the trench. The non-insulating material is etched or chemical-mechanical polished. Another non-insulating material is introduced adjacent to the already structured first non-insulating material and is then structured to form a gate electrode for a field effect transistor. An auxiliary layer, for example composed of silicon nitride, may be applied before the structuring of the non-insulating material. The auxiliary layer is structured together with the isolating trench. The auxiliary layer is then etched back isotropically. This procedure ensures that projecting areas can be produced which form adjustment tolerances in the rest of the procedure. The adjustment tolerances make it possible to produce electrical components with sufficiently good electrical characteristics, despite the processes for production of further layers not being carried out with high precision. The auxiliary layer may also be used in conjunction with the production of isolating layers, in particular with the production of tunnel oxide layers.

Turning to the figures, FIG. 1 shows the circuit diagram of a memory circuit 10 which contains a plurality of mutually identical memory cell areas 12, 14 (or memory segments). Accordingly, only the design of one memory cell area 12 will be explained in the following text. The memory circuit 10 contains a large number of global bit lines BL0 to BLm of which three global bit lines BL0, BL1 and BL2 are illustrated in FIG. 1. Further global bit lines 16 are indicated by dots.

The memory cell area 12 contains a row of drain selection transistors TD0 to TDm, of which three selection transistors TD0, TD1 and TD2 are illustrated in FIG. 1. The gate electrodes of the drain selection transistors TD0, TD1 and TD2 are connected to a drain selection line DAL, which is located in the row direction.

Furthermore, the memory cell area 12 contains a large number of memory cell transistors T01 to Tmn, fifteen memory cell transistors T00 to T24 of which are illustrated in FIG. 1. The first index in each case indicates the column. The second index in each case indicates the row. The memory cell transistor T12 is thus located in the column with the index 1, and in the row with the index 2.

The gate connections of the memory cell transistors in one row in the memory cell array are each connected to one another via a word line WL0 to WLn, four word lines WL0 to WL4 of which are illustrated in FIG. 1. Further word lines 18 are indicated by dots.

The memory cell transistors T00 to T24 are floating gate transistors, in which charges are stored in an isolated electrode, the floating gate.

In addition, the memory cell area 12 contains source selection transistors TS0 to TSn, three source selection transistors TS0 to TS2 of which are illustrated in FIG. 1. The gate electrodes of the source selection transistors TS0 to TS1 are connected by means of a source selection line SAL.

The memory cell area 12 also contains isolating wells W0 to Wm, three isolating wells W0 to W2 of which are illustrated in FIG. 1. The isolating wells W0 to Wm are bounded by isolating trenches G0 to Gm+1, four isolating trenches G0 to G3 of which are illustrated in FIG. 1. The isolating trench G1 is thus located between the isolating well W0 and the isolating well W1.

Memory cell transistors in one column as well as a drain selection transistor and a source selection transistor for selection of the memory cell transistors in this column are located in each isolating well W0 to W2. By way of example, the isolating well W0 contains the drain selection transistor TD0, the memory cell transistors T00 to T04, as well as the source selection transistor TS0. The arrangement of the transistors in each well W0 to Wm is the same, so that only the design of the well W0 will be explained in the following text.

The drain connection of the drain selection transistor TD0 is connected to the bit line BL0. A source connection of the drain selection transistor TD0 is connected via a drain line 20 to the drain connections of the memory cell transistors T00 to T04.

The source connections of the memory cell transistors T00 to T04 are electrically connected via a respective contact section 30, 40, 50, 60 or 70 to the well W0. In addition, the well W0 is electrically connected to the drain connection of the source selection transistor TS0. The source connection of the drain selection transistor TS0 is connected to a global source line SL0. The other isolating wells W1, W2 etc. have their own global source lines SL1, SL2 etc.

The use of local drain lines 20, 22 and 24 makes it possible to form minisectors 100, which contain only memory cell transistors in a column section, and not an entire column. This offers advantages in terms of the power consumption of the memory circuit 10 and in terms of the writing, reading and erasure speed.

Figure 2:
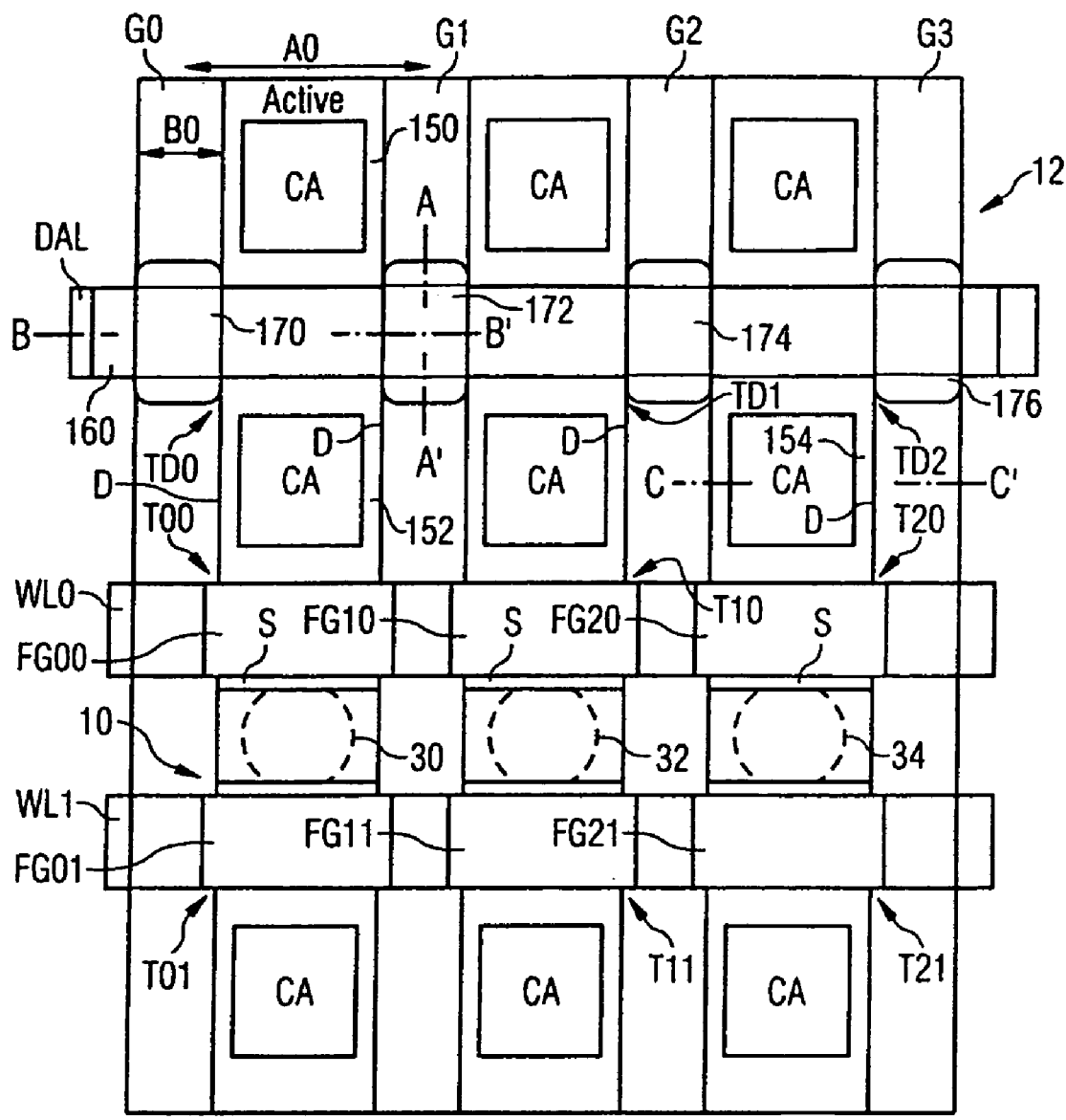
FIG. 2 shows a plan view of the memory cell area.

FIG. 2 shows a plan view of the memory cell area 12. The meaning of reference symbols which have already been explained above with reference to FIG. 1 will not be explained again with reference to FIG. 2, since these reference symbols denote the same components of the memory area 12. The width B0 of the isolation trenches G0 to G3 is, for example, 100 nm. The distance A0 between the center lines of mutually adjacent isolation trenches is, for example, 250 nm. The distance A0 is also referred to as the bit line pitch, because the distance A0 likewise denotes the distance between adjacent drain lines 20, 22, 24. In the exemplary embodiment, the bit lines 20, 22 and 24 are located above the substrate 200.

FIG. 2 also shows the floating gates FG00 to FG21 of the memory cell transistors T01 to T21. Contact areas CA above the channel connection regions are somewhat smaller than the channel connection regions arranged underneath, that is to say than the source areas and the gate areas. The channel connection regions are produced by self-adjusting implantation after the application of the drain selection line DAL, of the word lines WL0 to WLm and of the source selection line SAL. The drain selection transistor TD0 has, for example, a channel connection region 150 and a channel connection region 152, which at the same time forms the source area of the drain selection transistor TD0 and the drain area of the memory cell transistor T00.

A line 160 which is isolated from the drain selection line DAL by an isolating layer is located above the drain selection line DAL. Gate areas 170, 172, 174, 176 etc. in the area of the drain selection line DAL extend into the isolating trenches G0, G1, G2, G3 etc. The gate areas 170 form the side areas of the triple gate transistors TD0, TD1 and TD2.

FIG. 2 also shows the positions of three cross sections, specifically: a cross section A-A' through the gate area 172 in the column direction, a cross section B-B' through the drain connecting line DAL in the row direction, between the isolation trenches G0 and G1, and a cross section C to C' through a channel connection region 154 of the drain selection transistor TD2 and of the memory cell transistor T0 in the row direction.

Figure 3:
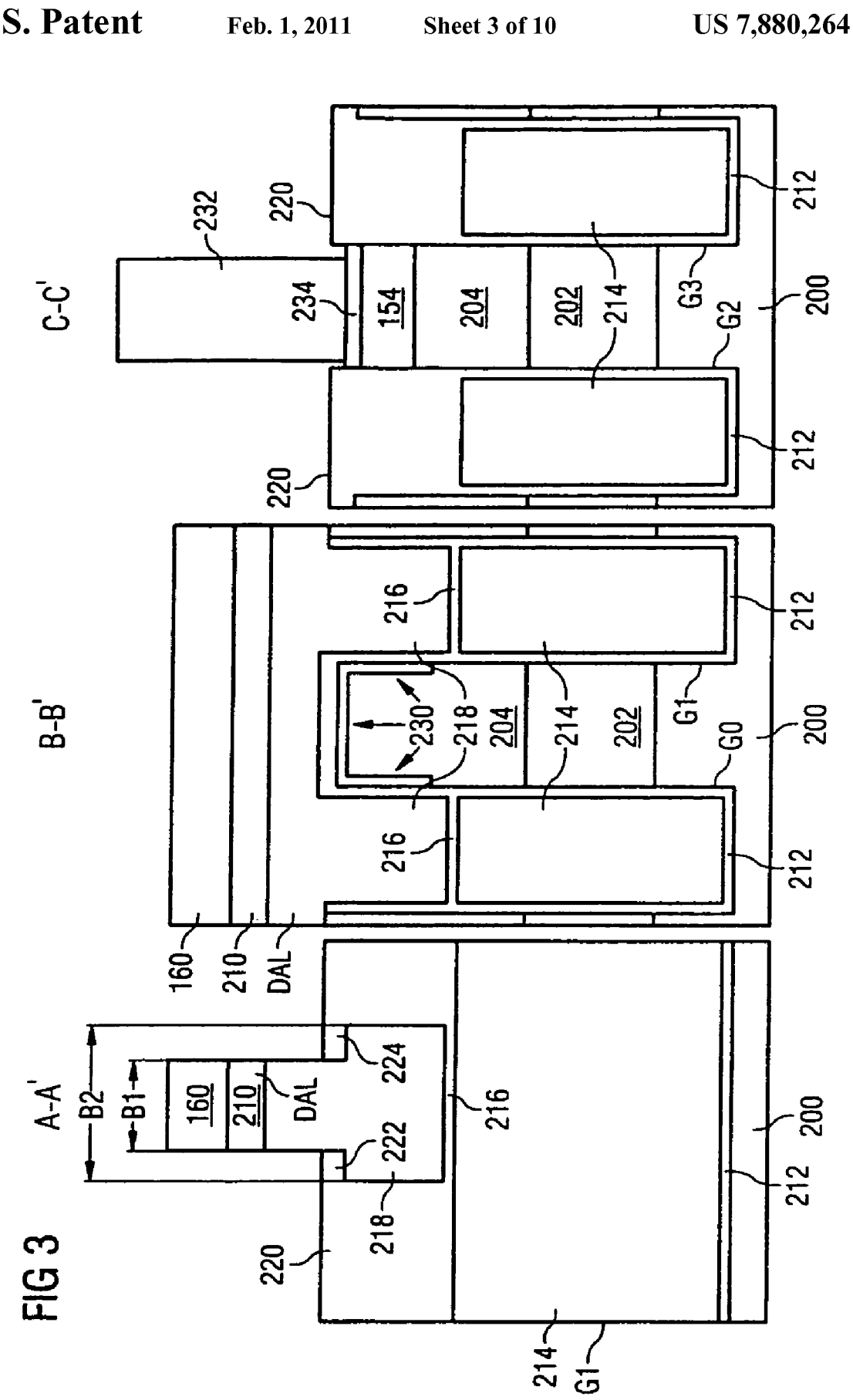
FIG. 3 shows three cross sections through the memory cell area.

FIG. 3 shows the cross sections A-A', B-B' and C-C'. The memory circuit 10 is arranged in a weakly p-doped substrate 200 on a silicon base. An n-doped layer 202 and a p-doped layer 204 have been produced in the silicon substrate 200. The layers 202 and 204 form the well W0 in the area of the cross section B-B'. The layers 202 and 204 form the well W2 in the area of the cross section C-C'.

As can be seen well in FIG. 3, an ONO layer 210 is located under the line 160 composed of doped polycrystalline silicon. The ONO layer 210 contains a layer sequence from the bottom, that is to say from the substrate 200, upwards comprising silicon dioxide, silicon nitride and oxynitride. The drain selection line DAL is composed of polycrystalline silicon, which has been doped in situ or retrospectively.

The trenches G0 to G3 are isolated from the substrate 200 at the trench base and on the trench walls by means of a rim oxide 212. The rim oxide 212 is narrower than the trench width. By way of example, the width of the rim oxide is only 10 nm, e.g. less than 1/5 of the trench width. The lower areas of the trenches G0 to G3 are filled with polycrystalline silicon 214, which may be doped or undoped. An intermediate wall oxide 216, which is located parallel to the trench base and whose thickness is, for example, 20 nm, is located in the upper third of the trenches G0 to G3, in the area of the selection transistors TD0 to TD2. The intermediate wall oxide 216 forms a cover without any interruption extending from one isolated trench wall to the opposite isolated trench wall. In other exemplary embodiments, the thickness of the intermediate wall oxide is less than 50 nm. The intermediate wall oxide 216 is located at a height above the trench base of a trench G0 to G3 corresponding to about 2/3 of the trench depth of a trench G0 to G3. Either polycrystalline silicon 218 or, at different points, an insulating material 220, for example silicon dioxide, is located in the trenches G0 to G3 above the intermediate wall oxide 216.

As can be seen well in the cross section A-A', the drain connecting line DAL is narrower than the area of the trench G1 which is filled with polycrystalline silicon 218. A width B1 of the drain selection line DAL is thus only approximately half the width B2 of the polycrystalline silicon 218 underneath the drain selection line DAL.

As can likewise be seen well in FIG. 3, cross section A-A', the insulating material 220 has projections 222, 224 which project over the polycrystalline silicon 218 and extend as far as the drain selection line DAL. As shown in FIG. 3, cross section B-B', the drain selection line DAL and the polycrystalline silicon 218 form a triple gate transistor with a U-shaped channel area 230.

As illustrated in FIG. 3, cross section C-C, the drain lines 20 to 24 are arranged above the substrate 200. A contact 232 leads from the drain line to the channel connection region 154. A silicide area 234 is located between the contact 232 and the channel connection region 154. Silicide areas which are similar to the silicide area 234 form parts of the contact sections 30 to 74.

Figure 4:
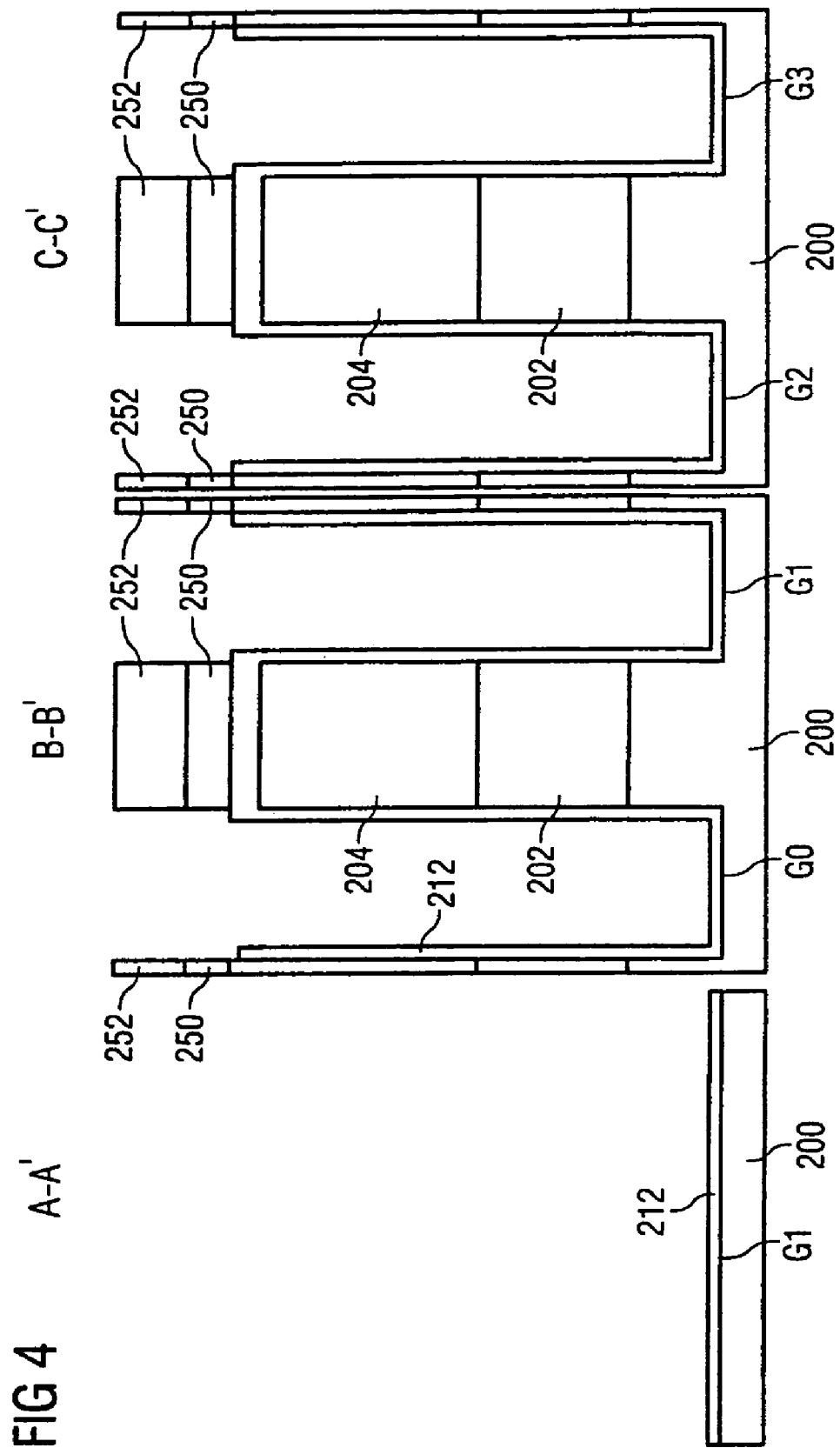

The method for production of the memory circuit 10 will be explained in the following text with reference to FIGS. 4 to 10. As is illustrated in FIG. 4, the n-doped layer 202 and the p-doped layer 204 are implanted first of all, in order to form a large-area isolating layer. The large-area isolating layer is then subdivided by etching of the isolating trenches G0 to G3 into a large number of small isolating wells in the form of strips. During this process an auxiliary layer 250 is first of all applied to the substrate 200 and, for example, is composed of silicon nitride or contains silicon nitride. By way of example, a boron-phosphorus-silicate glass (BPSG) layer 252 is applied to the auxiliary layer 250. The glass layer 252 is used as a hard mask during etching of the deep isolating trenches. The glass layer 252 is structured with the aid of a photoresist mask, which is not illustrated. The auxiliary layer 250 is then structured with the aid of the glass layer 252. The glass layer 252 is then removed. The auxiliary layer 250 is now used as a hard mask for the introduction of the isolation trenches G0 to G3, for example by means of a reactive ion etching process. Alternatively, it is also possible to use just the auxiliary layer 250 and no glass layer 252.

Figure 5:
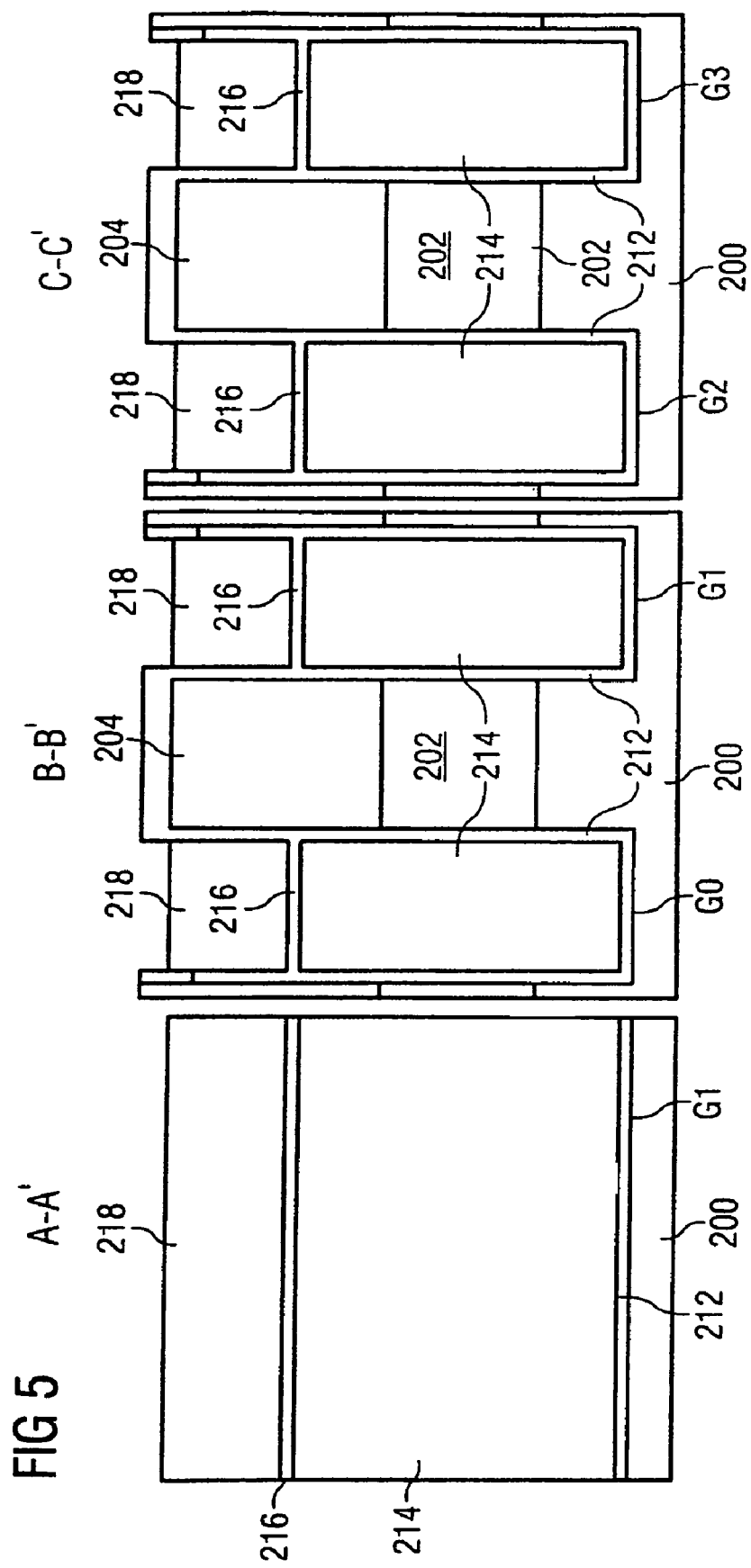

The rim oxide 212 is then produced in the isolation trenches G0 to G3, for example by means of thermal oxidation. The rim oxide acts as a liner oxide. After production of the rim oxide 212, as is shown in FIG. 5, the isolating trenches G0 to G3 are filled with the polycrystalline silicon 214, which is doped in situ. The polycrystalline silicon 214 is etched back, so that only about ⅔ of each isolation trench G0 to G3 is still filled.

The intermediate wall oxide 216 is then produced, for example by thermal oxidation. After the production of the intermediate wall oxide 216, the upper areas of the isolation trenches G0 to G3 are filled with the polycrystalline silicon 218, which is doped in situ. The polycrystalline silicon 218 is etched back. The auxiliary layer 250 is then removed, thus resulting in the process state illustrated in FIG. 5. During the process of etching back the polycrystalline silicon 218, this polycrystalline silicon is also removed within the isolation trenches G0 to G3 in an upper area, for example to a depth of 50 nm starting from the trench rim of the isolation trenches G0 to G3.

Figure 6:
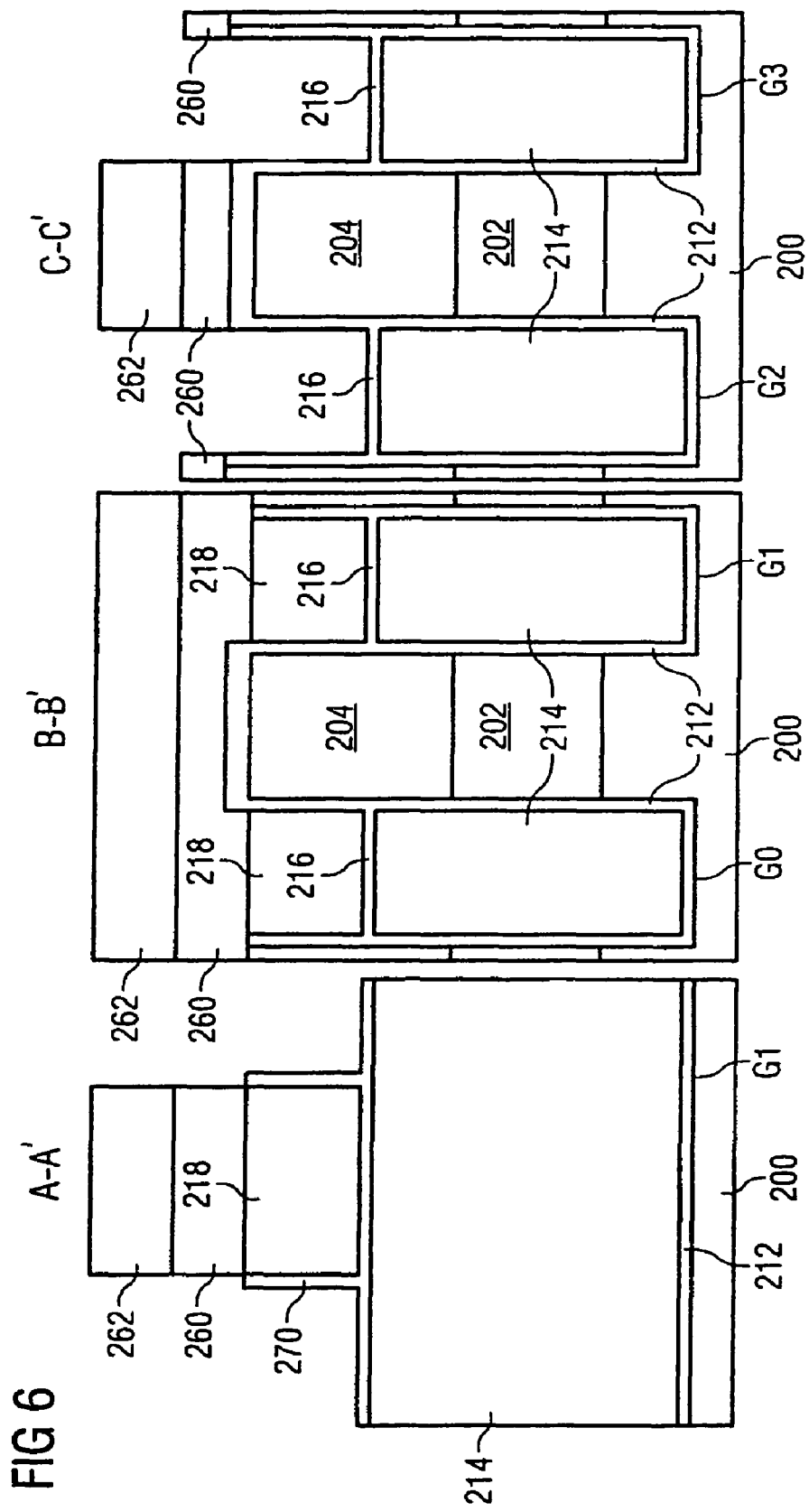

As is illustrated in FIG. 6, flat isolation trenches are then produced in the memory circuit 10 with the aid of a photomask and, if required, also with the aid of a hard mask. For this purpose, a further auxiliary layer 260 is applied, as is a glass layer 262 if desired. The further auxiliary layer 260 is composed of silicon nitride, for example. The glass layer 262 and the auxiliary layer 260 are structured with the aid of a photomask, which is not illustrated. The flat trenches are then etched, with the polycrystalline silicon 218 in the deep isolation trenches G0 to G3 being structured at the same time without any need for additional method steps. The polycrystalline silicon 218 is not removed at the points at which the gate areas of the drain selection transistors TD0 to TDm are intended to be produced for selection of a minisector 100, see FIG. 6, cross section B-B', as well as the central area in the cross section A-A'.

In contrast, the polycrystalline silicon 218 in the area of the memory cell transistors is removed approximately to the level of the intermediate wall oxide 216, see FIG. 6, cross section C-C'. The polycrystalline silicon 218 is also removed at the side of the gate area 172, see the rim areas in the cross section A-A'. In consequence, the mask for definition of the flat trenches also defines the position of the side gate areas of the selection transistors.

A line oxide 270 is then produced in the flat trenches and in the exposed upper areas of the isolation trenches G0 to G3, for example by means of thermal oxidation.

As is illustrated in FIG. 7, the auxiliary layer 260 is then etched back by means of an isotropic etching process, although the remaining areas of the auxiliary layer 260 are not completely removed.

The insulation material 220 is then applied in order to fill the flat isolation trenches as well as the upper areas of the deep isolation trenches G1 to G3 which have just been exposed. During this process, the projections 222 and 224 as well as the projections 272 and 274 are formed on side surfaces on which the auxiliary layer 260 has been isotropically etched back. For example, silicon dioxide is deposited using a high density plasma (HDP) process. The insulating material 220 is then planarized, for example by means of a chemical mechanical polishing (CMP) process. Any residue of the insulating material 220 remaining on the auxiliary layer 260 may be removed by means of an additional method step, for example wet-chemically by immersion in hydrofluoric acid HF.

As shown in FIG. 8, a part of the auxiliary layer 260 which is remote from the substrate is then removed, for example by means of an isotropic etching method, in particular reactive ion etching (RIE). The auxiliary layer 260 remains only at those points at which it was arranged underneath the substrate surface of the substrate 200, that is to say above the polycrystalline silicon 218. In contrast, the auxiliary layer 260 is removed at thinner points, specifically above the isolating wells W0 to W2, see in particular FIG. 8, cross section B-B' and cross section C-C'.

Oxide layers above the wells W0 to W2 are then removed, for example wet-chemically. The removal of the oxide layers exposes substrate area 280 as well as substrate area 282 between the thinned projections 272 and 274.

As illustrated in FIG. 9, the first part of a high-voltage oxide is then produced, for example by means of thermal oxidation. The first part of the high-voltage oxide layer 290 is removed on the memory cell transistors T01 to Tmn, with the first part of the high-voltage oxide layer 290 remaining in the area of the drain selection transistors TD0 to TDm, and in the area of the source selection transistors TS0 to TSm.

In a next method step, the tunnel oxide is produced in the area of the memory cell transistors T01 to T24, for example by means of thermal oxidation. During this process, the thickness of the high-voltage oxide layer 290 is increased further in the area of the selection transistors, so that it is possible to switch higher voltages there, for example of more than 5 volts.

The remaining residue of the auxiliary layer 260 is then removed, resulting in the formation of a cutout 300 between the projections 222 and 224. Furthermore, the polycrystalline silicon 218 in the isolation trenches G0 to G1 is exposed, see FIG. 9, cross section A-A' and cross section B-B'.

As illustrated in FIG. 10, polycrystalline silicon 310 is then deposited over the entire surface and, for example, is doped in situ. The ONO layer 210 is then deposited, as has already been described above with reference to FIG. 3. A further polycrystalline layer is then deposited and, for example, is doped in situ. The further polycrystalline layer contains, inter alia, the same material as the line 160.

The further polycrystalline layer, the ONO layer 210 and the polycrystalline silicon 310 are then structured by means of a photolithographic step, with, inter alia, the drain connecting line DAL being produced. In addition, the gate stacks are produced in the area of the memory cell transistors T01 to T24.

The contact sections 30 to 74 are then produced, with the silicide areas 234 being produced. Subsequently, metallization areas are produced in the memory circuit 10, and the memory circuit 10 is passivated.

The methods which have been explained can be used with a considerable increase in the integration level by the use of buried straps (BS), that is to say silicided contacts from the source regions to isolated p-well strips in conjunction with buried bit lines (BBL), in particular when using the SNOR architecture explained with reference to the figures. This is because, in these situations, further increase in the integration level is limited by the width of the selection transistor for each minisector. Formation of forming the selection transistors using the upper areas of isolating trenches as triple gate transistors in a three-dimensional form permits better space usage. This allows the effective channel width to be maintained or even to be increased without additional chip area being used. Furthermore, the selection transistors have better electronic characteristics, in particular a steeper lower threshold voltage rise and a smaller quiescent current than the previously used planar transistors, and than so-called dual-gate transistors, as well.

In addition, other memory types instead of the flash memories which have been mentioned may make use of the isolation trenches. For example, other memory circuits which store charge in a non-volatile form.

It is therefore intended that the foregoing detailed description be regarded as illustrative rather than limiting, and that it be understood that it is the following claims, including all equivalents, that are intended to define the spirit and scope of this invention. Nor is anything in the foregoing description intended to disavow scope of the invention as claimed or any equivalents thereof.

We claim:

1. An integrated circuit arrangement comprising:
   a memory array having at least a first column of memory cells and a second column of memory cells, wherein the first and second column of memory cells are EEPROM cells;
   a first field effect transistor electrically connected to the memory cells in at least a section of the first column;
   a second field effect transistor electrically connected to the memory cells in at least a section of the second column; and
   an isolating trench isolating the first column of memory cells from the second column of memory cells;
   each of the first and second transistors having a gate area extending into the isolating trench;
   wherein the first and second field effect transistors are selection transistors and are configured to enable simultaneous selection of the memory cells in a column or a column section of the memory cells;
   the first field effect transistor and the second field effect transistor has a triple gate;
   wherein the first transistor having the triple gate has two mutually opposite gate areas, the two mutually opposite gate areas of the first transistor are connected by a first central gate area;
   wherein the second transistor having the triple gate has two mutually opposite gate areas, the two mutually opposite gate areas of the second transistor are connected by a second central gate area; and
   the first transistor has a first U-shaped channel and the second transistor has a second U-shaped channel.

2. The circuit arrangement of claim 1, wherein the isolating trench is bounded by a trench base, trench walls and a trench rim; and
   at least one of: an intermediate wall isolating area is at a distance from the trench base which is greater than ⅕ of the trench depth or the gate area of the field effect transistor extends at most only as far as half the trench depth of the isolating trench.

3. The circuit arrangement of claim 2, wherein the first field effect transistor or the second field effect transistor is isolated by a portion of the isolating trench which is deeper than other portions of the isolating trench.

4. The circuit arrangement of claim 1, wherein an electrically insulating isolation layer and an electrically conductive layer are arranged on the a side of the gate area of the first field effect transistor or the second field effect transistor, facing away from a substrate, and are jointly structured together with at least a part of the gate area.

5. The integrated circuit arrangement of claim 1 further comprising:
   the isolating trench bounded by a trench base, trench walls, and a trench rim; and
   an intermediate wall isolating area containing electrically insulating material in a central area between two opposite trench walls and at a distance from the trench base, the isolating trench containing an electrically conductive material that forms a gate area of the field effect transistor and that extends beyond the trench rim into an isolating trench which is adjacent to the isolating trench.

6. The circuit arrangement of claim 5, wherein at least one of:
   at least one selection line for selection of the memory cells in the first column or the second column is arranged in the isolating trench or in a further isolating trench,
   memory cells in at least one of the first column or the second column are arranged in a doped layer which is electrically isolated by the isolating trench or by a further isolating trench from a doped layer for memory cells in an adjacent column,
   memory cells in at least one of the first column or the second column are electrically conductively connected to one another via a doped layer in the substrate or in an isolating trench, or
   the isolating trench has a length which is more than twice as long as its width.

7. The circuit arrangement of claim 5, wherein an electrically insulating isolation layer and an electrically conductive layer are arranged on the side of the gate area of the first or second transistor facing away from a substrate, and are jointly structured together with at least a part of the gate area.

* * * * *